United States Patent
Veenker

(10) Patent No.: US 9,225,133 B2
(45) Date of Patent: Dec. 29, 2015

(54) QUICK-MOUNT BALLASTS

(71) Applicant: Darren Veenker, Hillsboro, OR (US)

(72) Inventor: Darren Veenker, Hillsboro, OR (US)

( * ) Notice: Subject to any disclaimer, the term of this patent is extended or adjusted under 35 U.S.C. 154(b) by 158 days.

(21) Appl. No.: 14/155,219

(22) Filed: Jan. 14, 2014

(65) Prior Publication Data

US 2014/0198430 A1 Jul. 17, 2014

Related U.S. Application Data

(60) Provisional application No. 61/752,222, filed on Jan. 14, 2013.

(51) Int. Cl.
| | |
|---|---|
| H02B 1/00 | (2006.01) |
| H02B 1/26 | (2006.01) |
| H02B 1/18 | (2006.01) |
| H02B 1/30 | (2006.01) |
| H01R 33/06 | (2006.01) |
| H05K 5/00 | (2006.01) |
| H05B 41/00 | (2006.01) |

(52) U.S. Cl.
CPC .............. *H01R 33/065* (2013.01); *H05B 41/00* (2013.01); *H05K 5/00* (2013.01)

(58) Field of Classification Search
CPC .............. G06F 1/16; G06F 1/18; G06F 1/20; H05K 7/1489; H05K 7/1492; H05K 5/00; H05B 41/00; H01R 33/065
USPC .......................................... 361/674, 600, 641
See application file for complete search history.

(56) References Cited

U.S. PATENT DOCUMENTS

| | | | | |
|---|---|---|---|---|
| 4,719,540 | A | * | 1/1988 | San George et al. .......... 361/674 |
| 5,600,537 | A | * | 2/1997 | Gordin et al. ................. 361/674 |
| 5,691,878 | A | * | 11/1997 | Ahn et al. ..................... 361/674 |
| 7,965,494 | B1 | * | 6/2011 | Morris et al. ................. 361/674 |
| 2008/0169768 | A1 | * | 7/2008 | Yang ............................. 315/276 |
| 2013/0095689 | A1 | * | 4/2013 | Hayman et al. ............... 439/359 |

\* cited by examiner

*Primary Examiner* — Anthony Haughton
(74) *Attorney, Agent, or Firm* — Mohr Intellectual Property Law Solutions, PC

(57) ABSTRACT

Quick-mount ballasts including a body and a receiver. The body includes a first protrusion, a connecting portion distal the first protrusion, the connecting portion containing a primary plurality of electrical contacts, and a second protrusion proximate the connecting portion. The receiver includes a guide, a wire trap proximate the guide, a receiving portion distal the guide, the receiving portion containing a secondary plurality of electrical contacts, and a retainer proximate the receiving portion.

20 Claims, 6 Drawing Sheets

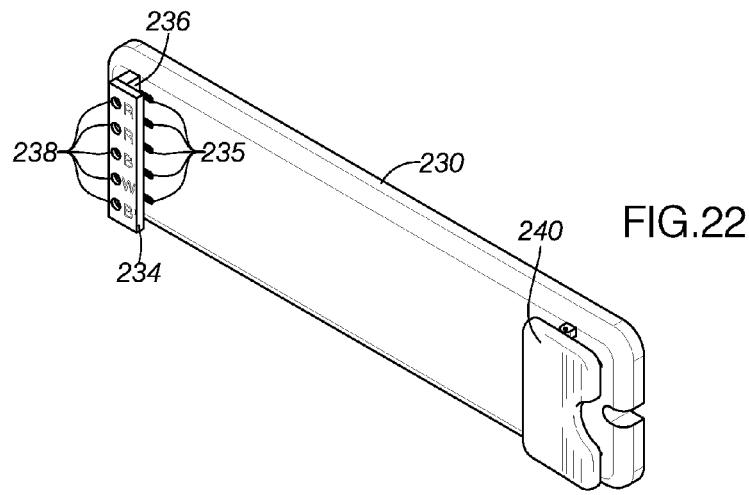
FIG.22
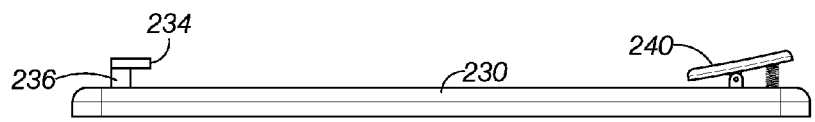
FIG.23
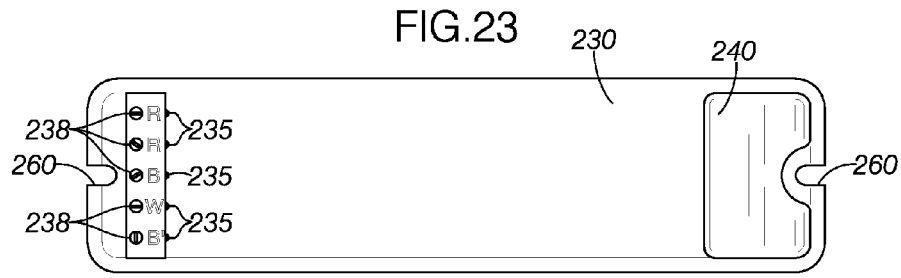
FIG.24
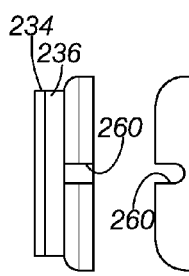
FIG.26
FIG.25
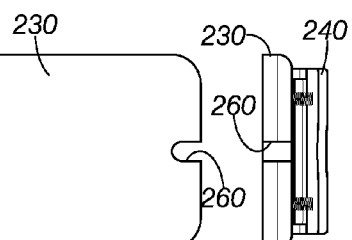
FIG.27

QUICK-MOUNT BALLASTS

CROSS REFERENCE TO RELATED APPLICATIONS

This application claims priority to U.S. Application Ser. No. 61/752,222, filed on Jan. 14, 2013, which is hereby incorporated by reference for all purposes.

BACKGROUND

The present disclosure relates generally to electrical ballasts. In particular, quick-mount ballasts are described.

Known electrical ballasts are not entirely satisfactory for the range of applications in which they are employed. For example, replacing existing electrical ballasts is labor intensive; cutting and splicing wires demands knowledge of electrical circuits, time, and labor.

Electrical ballasts are designed to limit the flow of electrical current in a fluorescent light fixture. Replacing existing electrical ballasts generally requires cutting existing wires that connect the defective ballast to the light fixture and splicing the fixture wires to a replacement ballast. Replacing electrical ballasts in fluorescent light fixtures can be a time-consuming and confusing task for those not versed in replacing electrical components. In fact, removing and replacing existing ballasts generally requires the skill and knowledge of a professional electrician.

In addition, conventional electrical ballasts are not modularly configured. Replacing a defective conventional electrical ballast requires replacing the entire electrical ballast when the ballast assembly ceases to function properly.

Conventional ballasts must be completely removed as an entire unit each time the conventional ballast ceases to function properly. Indeed, there is no simple method of quickly removing the defective ballast and replacing the defective ballast with a properly functioning plug-and-play or modular-type ballast.

Thus, there exists a need for quick-mount ballasts that improve upon and advance the design of known ballasts. Examples of new and useful quick-mount ballasts relevant to the needs existing in the field are discussed below.

SUMMARY

The present disclosure is directed to quick-mount ballasts including a body and a receiver. The body includes a first protrusion, a connecting portion distal the first protrusion, the connecting portion containing a primary plurality of electrical contacts, and a second protrusion proximate the connecting portion. The receiver includes a guide, a wire trap proximate the guide, a receiving portion distal the guide, the receiving portion containing a secondary plurality of electrical contacts, and a retainer proximate the receiving portion.

The guide is configured to receive the first protrusion, the receiving portion is configured to receive the connecting portion, the primary plurality of electrical contacts are complimentarily configured with the secondary plurality of electrical contacts, and the retainer is configured to retain the second protrusion. Retaining the connecting portion in the receiving portion connects the primary plurality of electrical contacts with the secondary plurality of electrical contacts to complete an electrical circuit. In some examples, the quick-mount ballast includes a connecting portion integrated with an edge of the body. In some further examples, the quick-mount ballast includes a spring-biased thumb latch retainer.

BRIEF DESCRIPTION OF THE DRAWINGS

FIG. 22 is a top end perspective view of a second example of a quick-mount ballast receiver including a receiving portion with an integrated secondary plurality of electrical contacts.

FIG. 23 is a side elevation view of the quick-mount ballast receiver shown in FIG. 22 depicting a retainer distal from the receiving portion.

FIG. 24 is a top elevation view of the quick-mount ballast receiver shown in FIG. 22 depicting a plurality of receptacles on a wire trap.

FIG. 25 is a bottom elevation view of the quick-mount ballast receiver shown in FIG. 22 depicting mounting elements on opposite ends of the receiver.

FIG. 26 is a left end elevation view of the quick-mount ballast receiver shown in FIG. 22 depicting the receiving portion and integrated wire trap.

FIG. 27 is a right end elevation view of the quick-mount ballast receiver shown in FIG. 22 depicting a spring-loaded thumb-latch retainer.

DETAILED DESCRIPTION

Figure 1:
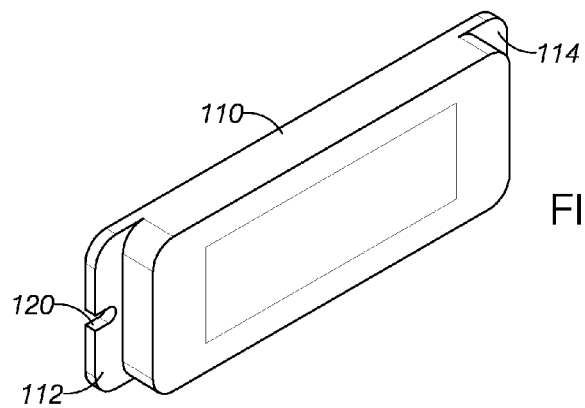
FIG. 1 is a top perspective view of a first example of a quick-mount ballast body.

The disclosed quick-mount ballasts will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various quick-mount ballasts are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

With reference to FIGS. 1-15, a first example of a quick-mount ballast, quick-mount ballast 100, will now be described. Quick mount ballast 100 includes a body 110 and a receiver 130.

Quick-mount ballast 100 is modularly configured to facilitate or allow rapidly replacing defective ballast components without confusion. Body 110 contains all electrical components (necessary for regulating electrical current in a light fixture) that are typically contained in conventional electrical ballasts. Body 110 mounts within receiver 130 and may be inserted and removed quickly and easily without cutting or splicing electrical wires.

Moreover, receiver 130 mounts within a fluorescent light fixture (not shown) in the same manner as existing ballasts. Receiver 130 may be wired directly to standard electrical wires (not shown) of the fixture either at a factory or aftermarket to replace conventional electrical ballasts. Body 110 mounts in receiver 130 to complete an electrical circuit. Thus, quick-mount ballast 100 obviates the need for rewiring typically required when replacing conventional electrical ballasts.

Quick-mount ballast 100 functions to quickly and efficiently replace defective electrical ballasts without the need to cut or splice wires. In other words, when body 110 ceases to function properly, body 110 can be removed and replaced by a new, properly functioning body quickly and easily. Receiver 130 is configured to fixedly mount within the light fixture and the new body snaps into place.

Additionally or alternatively, quick-mount ballast 100 eliminates the substantial time required to replace conventional ballasts by those not versed in replacing electrical components. Receiver 130 is wired to the light fixture once and remains in place when a ballast needs to be replaced. Replacing a defective or malfunctioning ballast merely requires removing and replacing body 110.

Thus, quick-mount ballast 100 offers a substantial improvement over existing electrical ballasts: generally, only body 110 is replaced in a matter of seconds rather than replacing the entire conventional electrical ballast, which can take hours and requires knowledge of electrical circuits.

As can be seen in FIGS. 1-6, 14, and 15, body 110 includes a first protrusion 112, a second protrusion 114, a connecting portion 116, a primary plurality of electrical contacts 118, and a recess 120. For ease of illustration, the figures do not depict an internal electrical circuit contained within body 110. The internal electrical circuit may be any electrical circuit suitable for regulating current in a light fixture as known in the art.

As shown in FIG. 1, body 110 is low-profile and rectangular. Alternatively, the body may be configured in any shape or form that facilitates or allows mounting the body within the receiver within a light fixture housing. Acceptable shapes include, but are not limited to, squares, triangles, pyramids, ovals, circles, and spheres.

In the FIG. 1 example, body 110 is comprised of plastic. Alternatively, the body may be comprised of any suitable material now known or later developed suitable for comprising ballast bodies. Suitable materials include, but are not limited to, wood, rubber, grounded metals, carbon fiber, and composites.

As shown in FIG. 1, first protrusion 112 comprises one edge of body 110. First protrusion 112 is configured to facilitate or allow placing and selectively retaining body 110 in receiver 130.

In the FIG. 1 example, first protrusion 112 is configured as a planar shelf. Alternatively, the first protrusion may be configured in any shape or form that facilitates or allows placing and retaining the body in the receiver. Acceptable first protrusion configurations include, but are not limited to, pins, posts hooks, tabs, lips, and beveled edges.

Figures 3, 5:
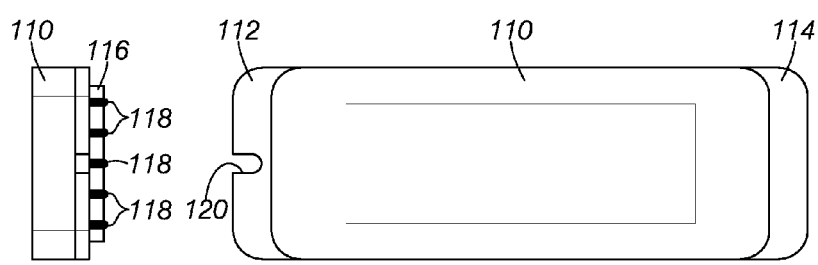
FIG. 3 is a top elevation view of the quick-mount ballast body shown in FIG. 1 depicting a recess on a first protrusion.
FIG. 5 is a left end elevation view of the quick-mount ballast body shown in FIG. 1 depicting the first protrusion.
Figure 6:
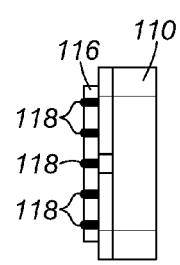
FIG. 6 is a right end elevation view of the quick-mount ballast body shown in FIG. 1 depicting a second protrusion distal the first protrusion.
Figure 4:
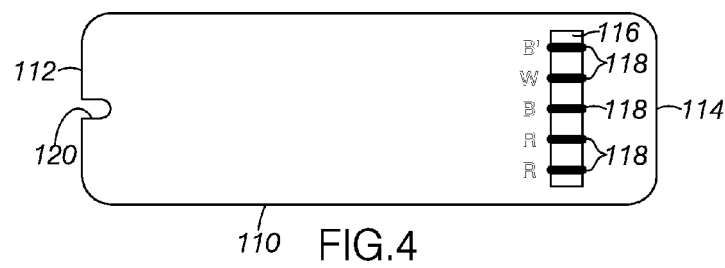
FIG. 4 is a bottom elevation view of the quick-mount ballast body shown in FIG. 1 depicting a primary plurality of electrical contacts.

As shown most clearly in FIG. 3, first protrusion 112 defines recess 120. Recess 120 is configured to facilitate or allow aligning body 110 with receiver 130. In the FIG. 3 example, recess 120 is singular. Alternatively, multiple recesses may be defined by the first protrusion.

Also shown in FIG. 3, second protrusion 114 comprises a second edge of body 110 distal from first protrusion 112. Second protrusion 114 is configured to facilitate or allow placing and selectively retaining body 110 in receiver 130.

In the FIG. 3 example, second protrusion 114 is configured as a planar shelf. Alternatively, the second protrusion may be configured in any shape or form that facilitates or allows placing and selectively retaining the body in the receiver as described above.

Figure 2:
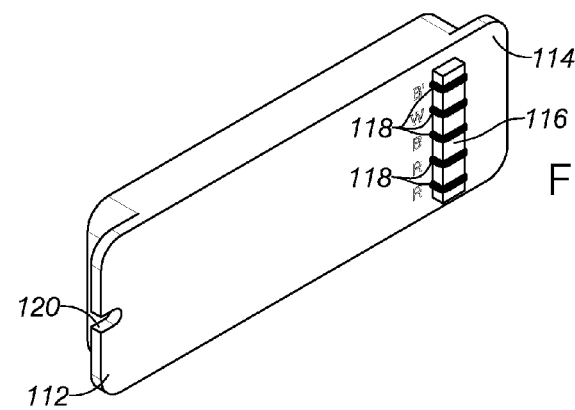
FIG. 2 is a bottom perspective view of the quick-mount ballast body shown in FIG. 1 depicting a connecting portion.

As shown in FIG. 2, connecting portion 116 is distal from first protrusion 112 and proximate to second protrusion 114.

In the FIG. 2 example, connecting portion 116 extends transverse a bottom surface of body 110. Alternatively, the connecting portion may be arranged in any manner that facilitates or allows connecting the body to the receiver.

Also shown in FIG. 2, connecting portion 116 contains a primary plurality of electrical contacts 118. Primary plurality of electrical contacts 118 are in electrical communication with the internal electrical circuit (not shown).

In the FIG. 2 example, primary plurality of electrical contacts 118 are female contacts. Additionally or alternatively, the primary plurality of electrical contacts may be male electrical contacts, or a combination of male and female electrical contacts.

As can be seen in FIGS. 7-15, receiver 130 includes a guide 132, an alignment element 133, a receiving portion 134, a secondary plurality of electrical contacts 135, a wire trap 136, a visual indicator 137, a plurality of receptacles 138, a retainer 140, a cavity 150, mounting elements 160, and internal wiring 170. Receiver 130 is complimentarily configured with body 110.

Figure 9:
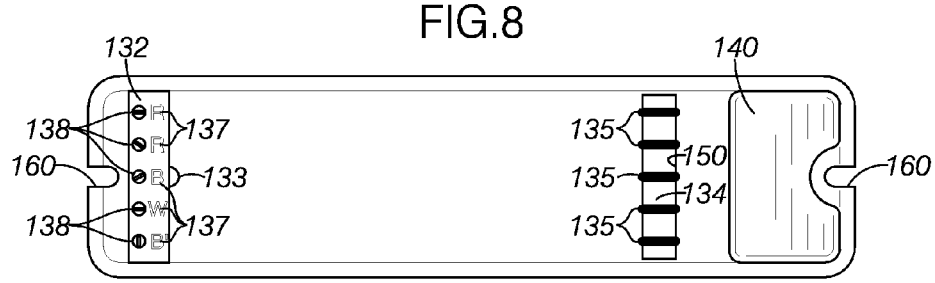
FIG. 9 is a top elevation view of the quick-mount ballast receiver shown in FIG. 7 depicting a plurality of receptacles on a wire trap.

As shown in FIG. 9, receiver 130 is substantially planar and rectangular. Alternatively, the receiver may be configured in any shape or form that facilitates or allows receiving and selectively retaining the body within a light fixture housing. Acceptable shapes include, but are not limited to, squares, triangles, ovals, and circles. Acceptable forms include, but are not limited to, rails, tension brackets, and frames.

In the FIG. 9 example, receiver 130 is comprised of plastic. Alternatively, the receiver may be comprised of any suitable material now known or later developed suitable for receivers. Suitable receiver materials include, but are not limited to, wood, rubber, grounded metals, carbon fiber, and composites.

Figure 7:
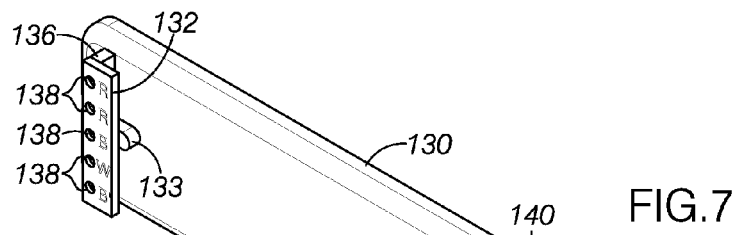
FIG. 7 is a top perspective view of a first example of a quick-mount ballast receiver.

As shown in FIG. 7, guide 132 facilitates or allows aligning and selectively retaining body 110 in receiver 130. Guide 132 is complimentarily configured with first protrusion 112.

Figure 14:
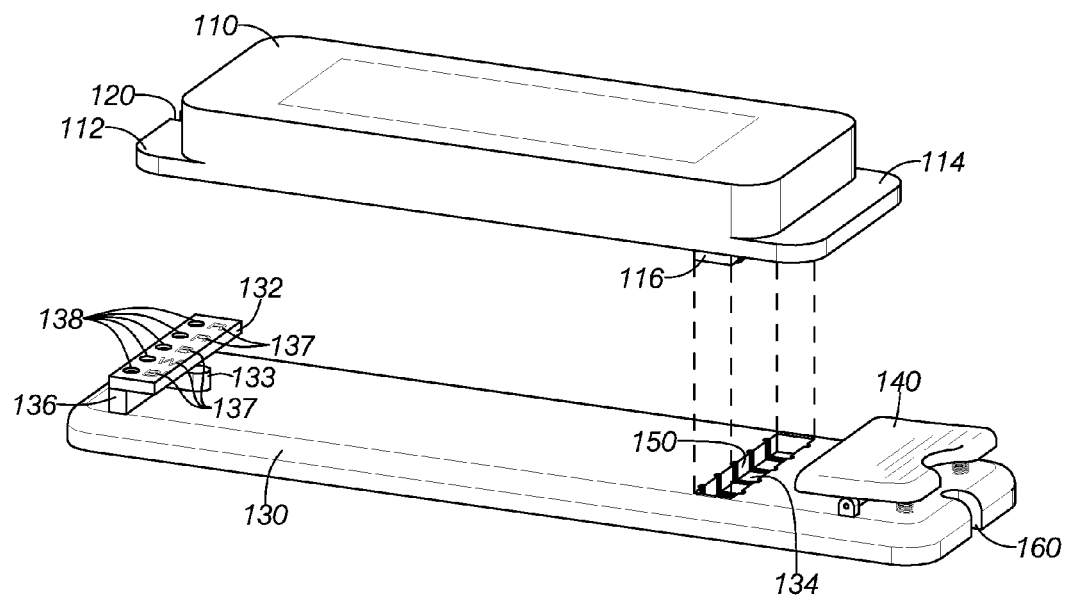
FIG. 14 is a side perspective view of the quick-mount ballast body shown in FIG. 1 and the quick-mount ballast receiver shown in FIG. 7 depicting a complimentary configuration between the body and the receiver.
Figure 15:
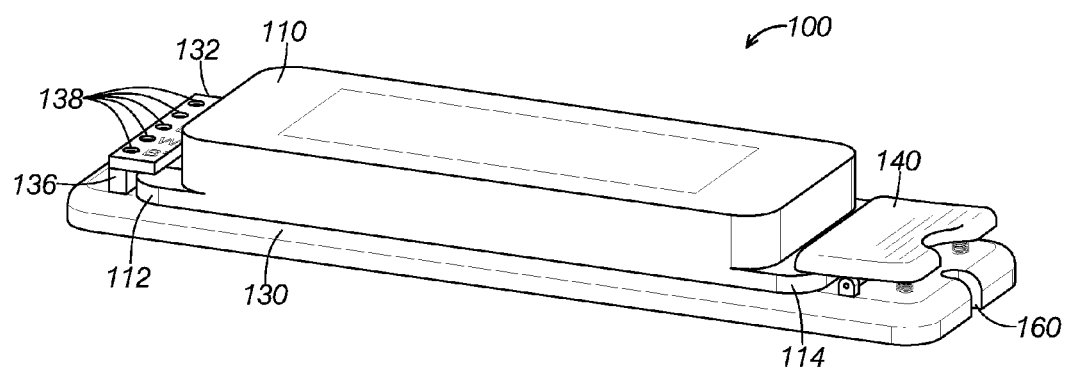
FIG. 15 is a side perspective view of the quick-mount ballast body shown in FIG. 1 and the quick-mount ballast receiver shown in FIG. 7 depicting the body retained in the receiver to comprise a quick-mount ballast.

As shown in FIG. 14, guide 132 retains first protrusion 112 via a friction fit. Alternatively, the guide may align and retain the first protrusion by any now known or later developed mechanism including, but not limited to, clasps, pins, posts, rails, and clips.

As shown most clearly in FIG. 7, guide 132 includes alignment element 133; alignment element 133 facilitates or allows aligning and selectively retaining body 110 in receiver 130. Alignment element 133 is complimentarily configured with recess 120.

In the FIG. 7 example, alignment element 133 is rigid. Alternatively, the alignment element may be configured in any shape or form that facilitates or allows aligning and selectively retaining the body in the receiver. For example, the alignment element may be spring-loaded or pivoting.

As shown in FIG. 7, receiving portion 134 is distal guide 132. Receiving portion 134 is complimentarily configured with connecting portion 116. Receiving portion 134 facilitates or allows aligning and retaining body 110 in receiver 130.

As can be seen in FIG. 7, receiving portion 134 is contained within cavity 150. Cavity 150 facilitates or allows aligning and retaining body 110 in receiver 130. Cavity 150 is configured to receive and selectively retain connecting portion 116.

Figure 8:
FIG. 8 is a side elevation view of the quick-mount ballast receiver shown in FIG. 7 depicting a retainer distal from a guide.

As shown in FIGS. 8 and 14, receiving portion 134 contains a secondary plurality of electrical contacts 135. Secondary plurality of electrical contacts 135 are complimentarily configured with primary plurality of electrical contacts 118. In other words, connecting primary plurality of electrical contacts 118 with secondary plurality of electrical contacts 135 completes an electrical circuit to form a functioning quick-mount ballast 100 (depicted in FIG. 15). Conversely, disconnecting primary plurality of electrical contacts 118 from secondary plurality of electrical contacts 135 interrupts or breaks the electrical circuit.

In the FIG. 8 example, secondary plurality of electrical contacts 135 are male contacts. Additionally or alternatively, the secondary plurality of electrical contacts may be female electrical contacts, or a combination of male and female electrical contacts.

As shown most clearly in FIG. 9, secondary plurality of electrical contacts 135 are in electrical communication with internal wiring 170 Likewise, internal wiring 170 is in electrical communication with wire trap 136. Thus, secondary plurality of electrical contacts 135 are in electrical communication with wire trap 136.

As shown in FIGS. 8 and 9, wire trap 136 is integrated within guide 132. Wire trap 136 facilitates or allows connecting receiver 130 to the electrical wires (not shown) of the light fixture (not shown).

As can be seen in FIG. 8, wire trap 136 includes plurality of receptacles 138. Plurality of receptacles 138 facilitate or allow connecting the electrical wires (not shown) of the light fixture (not shown) to receiver 130.

In the FIG. 8 example, plurality of receptacles 138 are threaded post receptacles. Alternatively, any now known or later developed mechanism may be used to connect the wires of the light fixture to the receiver. Connecting mechanisms include, but are not limited to, modular connectors, wire-to-board connectors, and molex® connectors.

As shown most clearly in FIG. 8, guide 132 includes visual indicator 137. Visual indicator 137 facilitates or allows proper wiring of the light fixture to plurality of receptacles 138. In other words, visual indicator 137 facilitates or allows proper wiring of receiver 130, enabling quick-mount ballast 100 to regulate current in the light fixture.

Also shown in FIG. 8, retainer 140 is proximate to receiving portion 134 and distal from guide 132. Retainer 140 facilitates or allows selectively retaining body 110 in receiver 130.

In the FIG. 8 example, retainer 140 is a thumb latch. More specifically, retainer 140 is a spring-biased thumb latch. Alternatively, the retainer may be configured as any now known or later developed retaining mechanism including, but not limited to, friction tabs, buttons, clamps, clips, and hook-and-pile systems.

Figure 10:
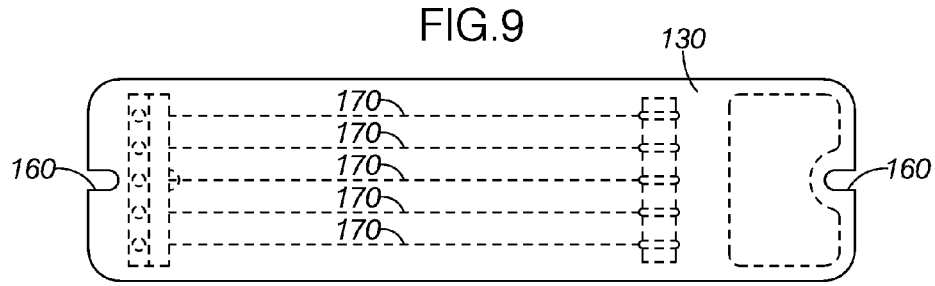
FIG. 10 is an internal view of the quick-mount ballast receiver shown in FIG. 7 depicting internal wiring connecting the wire trap with a secondary plurality of electrical contacts.
Figures 11, 12, 13:
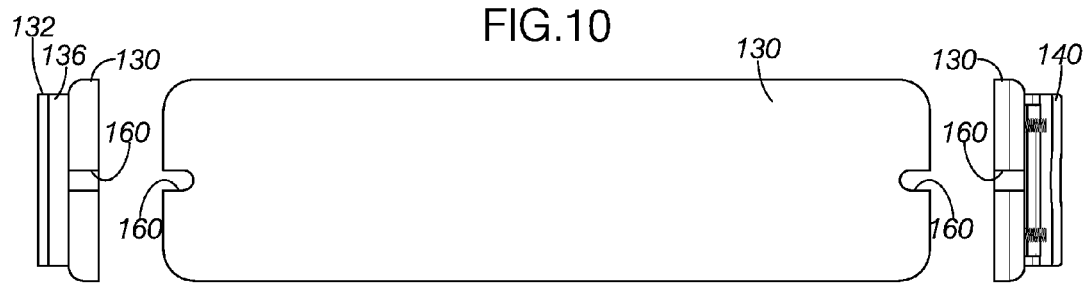
FIG. 11 is a bottom elevation view of the quick-mount ballast receiver shown in FIG. 7 depicting mounting elements on opposite ends of the receiver.
FIG. 12 is a left end elevation of the quick-mount ballast receiver shown in FIG. 7 depicting a mounting element.
FIG. 13 is a right end elevation of the quick-mount ballast receiver shown in FIG. 7 depicting a thumb-latch retainer.

As shown in FIG. 10, mounting elements 160 facilitate or allow mounting receiver 130 within or near a light fixture. In the FIG. 10 example, mounting elements 160 are recesses in the receiver wall sized and configured to accommodate conventional screws (not shown). Alternative mounting elements include, but are not limited to, cavities, windows, and tabs.

Turning attention to FIGS. 16-29, a second example of a quick-mount ballast, quick-mount ballast 200, will now be described. Quick-mount ballast 200 includes many similar or identical features to quick-mount ballast 200. Thus, for the sake of brevity, each feature of quick-mount ballast 200 will not be redundantly explained. Rather, key distinctions between quick-mount ballast 200 and quick-mount ballast 100 will be described in detail and the reader should reference the discussion above for features substantially similar between the two quick-mount ballasts.

As can be seen in FIGS. 16-29, quick-mount ballast 200 includes a body 210, a connection portion 212, a protrusion 214, a primary plurality of electrical contacts 218, a series of depressions 225, a receiver 230, a receiving portion 234, a secondary plurality of electrical contacts 235, a wire trap 236, a plurality of receptacles 238, a retainer 240, and mounting elements 260.

Quick-mount ballast 200 differs from quick-mount ballast 100 through the connecting mechanism between body 210 and receiver 230. Additionally, wire trap 236 is proximate to and in electrical communication with secondary plurality of electrical contacts 235 in this quick-mount ballast example; receiver 230 lacks internal wiring found in receiver 130.

Figure 16:
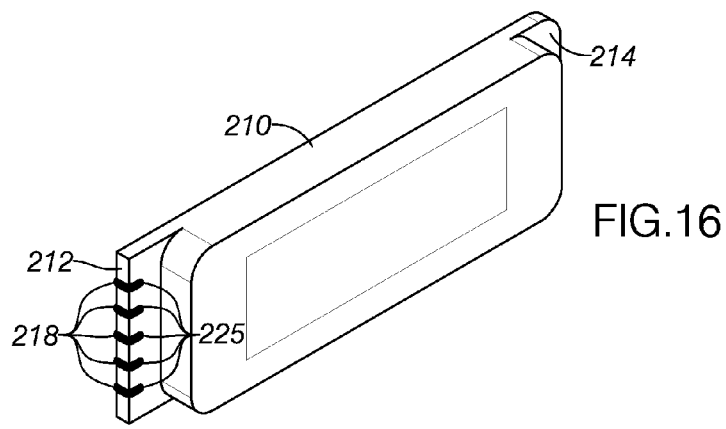
FIG. 16 is a top end perspective view of a second example of a quick-mount ballast body including a connecting portion with an integrated primary plurality of electrical contacts.
Figure 17:
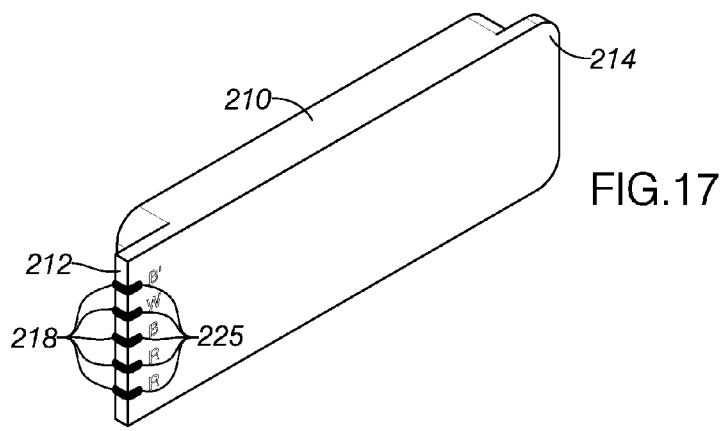
FIG. 17 is a bottom end perspective view of the quick-mount ballast body shown in FIG. 16 depicting a series of depressions containing the primary plurality of electrical contacts.
Figures 18, 20:
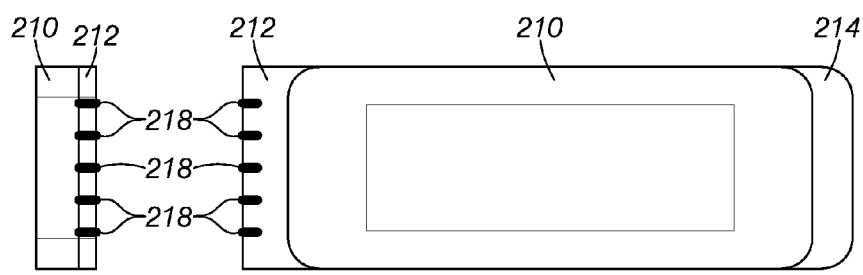
FIG. 18 is a top elevation view of the quick-mount ballast body shown in FIG. 16 depicting a protrusion distal from the connecting portion.
FIG. 20 is a left end elevation view of the quick-mount ballast body shown in FIG. 16 depicting the primary plurality of electrical contacts.
Figure 21:
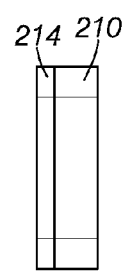
FIG. 21 is a right end elevation view of the quick-mount ballast body shown in FIG. 16 depicting the protrusion.
Figure 19:
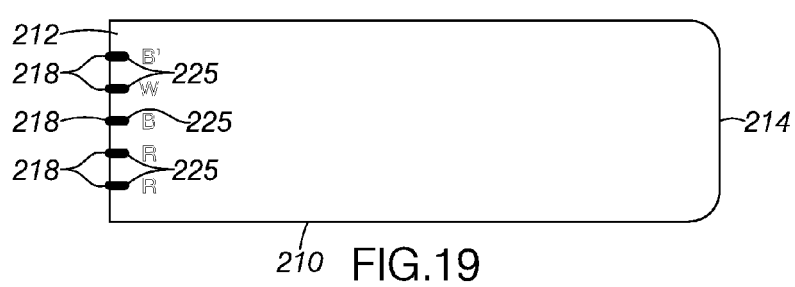
FIG. 19 is a bottom elevation view of the quick-mount ballast body shown in FIG. 16 depicting the series of depressions.

As shown in FIG. 16, connecting portion 212 comprises one end of body 210. In the FIG. 16 example, connecting portion 212 is configured as a planar shelf. Alternatively, the connecting portion may be configured in any shape or form that facilitates or allows placing and selectively retaining the body in the receiver. Acceptable connecting portion configurations include, but are not limited to, pins, posts hooks, tabs, lips, and beveled edges.

Also shown in FIG. 16, connecting portion 212 defines a series of depressions 225. Series of depressions 225 are integrally formed with a leading edge of connecting portion 212. Alternatively, the connecting portion may define any now known or later developed structure or void suitable for connecting the body to the receiver.

As shown in FIG. 16, series of depressions 225 contain a primary plurality of electrical contacts 218. Primary plurality of electrical contacts 218 are proximate the leading edge of connecting portion 212. Additionally, primary plurality of electrical contacts 218 are in electrical communication with an internal electrical circuit (not shown) contained within body 210.

In the FIG. 16 example, primary plurality of electrical contacts 218 are female contacts. Additionally or alternatively, the primary plurality of electrical contacts may be male electrical contacts, or a combination of male and female electrical contacts.

Figure 28:
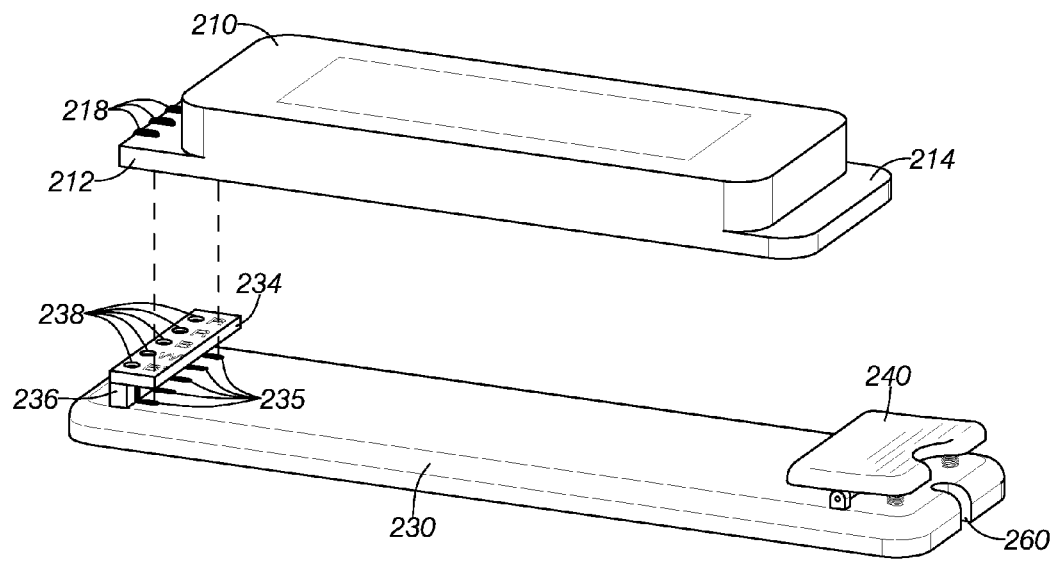
FIG. 28 is a side perspective view of the quick-mount ballast body shown in FIG. 16 and the quick-mount ballast receiver shown in FIG. 22 depicting a complimentary configuration between the body and the receiver.
Figure 29:
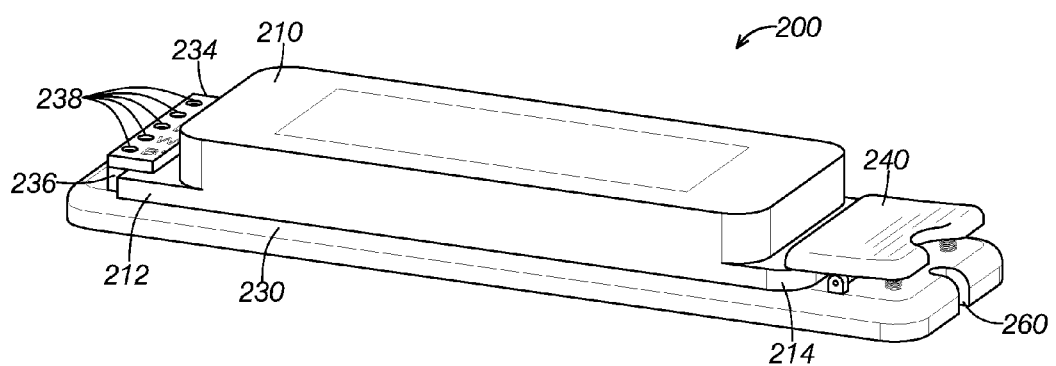
FIG. 29 is a side perspective view of the quick-mount ballast body shown in FIG. 16 and the quick-mount ballast receiver shown in FIG. 22 depicting the body retained in the receiver to comprise a quick-mount ballast.

As shown most clearly in FIG. 28, receiving portion 234 is configured to receive and selectively retain connecting portion 212. Receiving portion 234 is proximate one end of receiver 230 distal from retainer 240.

As shown in FIG. 28, secondary plurality of electrical contacts 235 are integrated within receiving portion 234. Secondary plurality of electrical contacts 235 are complimentarily configured with primary plurality of electrical contacts 218 and series of depressions 225. In other words, connecting primary plurality of electrical contacts 218 with secondary plurality of electrical contacts 135 completes an electrical circuit to form functional quick-mount ballast 200 (depicted in FIG. 29). Conversely, disconnecting primary plurality of electrical contacts 218 from secondary plurality of electrical contacts 235 interrupts or breaks the electrical circuit.

In the FIG. 28 example, secondary plurality of electrical contacts 235 are male contacts. Additionally or alternatively, the secondary plurality of electrical contacts may be female electrical contacts, or a combination of male and female electrical contacts.

As shown in FIG. 22, wire trap 236 is integrated within receiving portion 234. Wire trap 236 is in electrical communication with secondary plurality of electrical contacts 235. Wire trap 236 facilitates or allows connecting receiver 230 to electrical wires (not shown) of a light fixture (not shown).

As shown in FIG. 24, wire trap 236 includes plurality of receptacles 238. Plurality of receptacles 238 facilitate or allow properly connecting wire trap 236 to electrical wires (not shown) of a light fixture (not shown).

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A quick-mount ballast, comprising:
    a body including:
        a first protrusion;
        a connecting portion distal the first protrusion, the connecting portion containing a primary plurality of electrical contacts; and
        a second protrusion proximate the connecting portion; and
    a receiver including:
        a guide;
        a wire trap proximate the guide;
        a receiving portion distal the guide, the receiving portion containing a secondary plurality of electrical contacts; and
        a retainer proximate the receiving portion;
    wherein the guide is configured to receive the first protrusion, the receiving portion is configured to receive the connecting portion, the primary plurality of electrical contacts are complimentarily configured with the secondary plurality of electrical contacts, and the retainer is configured to retain the second protrusion, and
    wherein retaining the connecting portion in the receiving portion connects the primary plurality of electrical contacts with the secondary plurality of electrical contacts to complete an electrical circuit.

2. The quick-mount ballast of claim 1, further comprising an electrical circuit for regulating current in a fluorescent light fixture, the electrical circuit being in electrical communication with the primary plurality of electrical contacts.

3. The quick-mount ballast of claim 1, wherein the wire trap includes a plurality of receptacles for wiring the receiver to a fluorescent light fixture.

4. The quick-mount ballast of claim 1, wherein the receiver includes internal wiring connecting the wire trap to the secondary plurality of electrical connections.

5. The quick-mount ballast of claim 1, wherein the receiver includes mounting elements for mounting the receiver inside the fluorescent light fixture.

6. The quick-mount ballast of claim 1, wherein the receiver defines a cavity, the cavity containing the receiving portion.

7. The quick-mount ballast of claim 1, wherein the guide includes an alignment element and a visual indicator depicting a proper wiring sequence of the wire trap.

8. The quick-mount ballast of claim 7, wherein the first protrusion defines a recess complimentarily configured with the alignment element.

9. The quick-mount ballast of claim 1, wherein the retainer is a thumb-latch.

10. The quick-mount ballast of claim 9, wherein the retainer is spring biased.

11. The quick-mount ballast of claim 10, wherein the connecting portion defines a series of depressions that contain the primary plurality of electrical contacts.

12. The quick-mount ballast of claim 10, wherein the retainer is configured to selectively release the protrusion.

13. A quick-mount ballast, comprising:
   a body including:
      a connecting portion containing a primary plurality of electrical contacts;
      an internal electrical circuit for regulating current in a fluorescent light fixture, the internal electrical circuit being in electrical communication with the primary plurality of electrical contacts; and
      a protrusion distal the connecting portion; and
   a receiver including:
      a receiving portion configured to receive the connecting portion, the receiving portion containing a secondary plurality of electrical contacts; and
      a wire trap integrated within the receiving portion and in electrical communication with the secondary plurality of electrical contacts;
      a retainer distal the receiving portion, the retainer configured to retain the protrusion;
      wherein the primary plurality of electrical contacts are complimentarily configured with the secondary plurality of electrical contacts and retaining the connecting portion in the receiving portion connects the primary plurality of electrical contacts with the secondary plurality of electrical contacts to complete an electrical circuit.

14. The quick-mount ballast of claim 13, wherein the secondary plurality of electrical contacts are friction pin contacts complimentarily configured with the series of depressions.

15. A quick-mount ballast, comprising:
   a body including:
      a first protrusion;
      a primary plurality of electrical contacts distal the first protrusion;
      an internal electrical circuit for regulating current in a fluorescent light fixture, the electrical circuit being in electrical communication with the primary plurality of electrical contacts; and
      a second protrusion proximate the primary plurality of electrical contacts; and
   a receiver including:
      a guide configured to receive and align the first protrusion;
      a wire trap integrated within the guide, the wire trap containing a plurality of receptacles configured to connect the receiver to electrical wires of a fluorescent light fixture;
      a cavity distal the guide;
      a secondary plurality of electrical contacts within the cavity, the secondary plurality of electrical contacts complimentarily configured with the primary plurality of electrical contacts and in electrical communication with the wire trap; and
      a retainer proximate the secondary plurality of electrical contacts, the retainer configured to selectively retain the primary plurality of electrical contacts in contact with the secondary plurality of electrical contacts to complete an electrical circuit.

16. The quick-mount ballast of claim 15, wherein the primary plurality of electrical contacts are complimentarily configured with the cavity.

17. The quick-mount ballast of claim 15, wherein the secondary plurality of electrical contacts are connected to the wire trap by electrical wiring within the receiver.

18. The quick-mount ballast of claim 15, wherein the receiver is substantially rectangular.

19. The quick-mount ballast of claim 15, wherein the receiver and the body are complimentary in shape and size.

20. The quick-mount ballast of claim 15, wherein the guide visually depicts the location of the plurality of receptacles corresponding to the electrical wiring from the fluorescent light fixture.

* * * * *